US006664602B2

(12) United States Patent
Yamashita et al.

(10) Patent No.: US 6,664,602 B2
(45) Date of Patent: Dec. 16, 2003

(54) SEMICONDUCTOR DEVICE AND METHOD OF MANUFACTURING THE SAME

(75) Inventors: Tomohiro Yamashita, Tokyo (JP); Masashi Kitazawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 3 days.

(21) Appl. No.: 10/194,233

(22) Filed: Jul. 15, 2002

(65) Prior Publication Data

US 2003/0030110 A1 Feb. 13, 2003

(30) Foreign Application Priority Data

Aug. 10, 2001 (JP) ........................................ 2001-243462

(51) Int. Cl.[7] .............................................. H01L 29/772
(52) U.S. Cl. ...................... 257/371; 257/548; 438/223; 438/224; 438/227; 438/228; 438/302
(58) Field of Search ................................ 257/371, 548; 438/302

(56) References Cited

U.S. PATENT DOCUMENTS

| 5,518,941 A | * | 5/1996 | Lin et al. .................... 437/43 |
| 5,734,185 A | * | 3/1998 | Iguchi et al. ................ 257/336 |
| 5,972,745 A | * | 10/1999 | Kalter et al. ................ 438/220 |
| 6,040,208 A | * | 3/2000 | Honeycutt et al. .......... 438/229 |
| 6,090,653 A | * | 7/2000 | Wu ............................. 438/231 |
| 6,097,078 A | * | 8/2000 | Sim et al. .................... 257/548 |
| 6,461,946 B2 | * | 10/2002 | Kitani et al. ................ 438/510 |

FOREIGN PATENT DOCUMENTS

| JP | 60-66829 | * | 4/1985 |
| JP | 63-183127 | * | 11/1988 |
| JP | 3-148818 | * | 6/1991 |
| JP | 6-163844 | | 6/1994 |
| JP | 10-74844 | | 3/1998 |
| JP | 2000-150878 | * | 5/2000 |
| JP | 2002-198420 | * | 7/2002 |

* cited by examiner

Primary Examiner—Nathan J. Flynn
Assistant Examiner—Ahmed N. Sefer

(57) ABSTRACT

An object of the invention is to suppress degradation of the effective isolation width between a well and a diffusion layer caused by impurity ion implantation for forming the well performed at a predetermined incident angle. A well is formed by performing impurity ion implantation twice: first impurity ion implantation from a first direction at predetermined incident angle, acceleration voltage and dose; and second impurity ion implantation from a second direction different from the first direction by 180 degrees in a plan view at the same incident angle, acceleration voltage and dose as those in the first impurity ion implantation.

2 Claims, 15 Drawing Sheets

F I G. 1 1
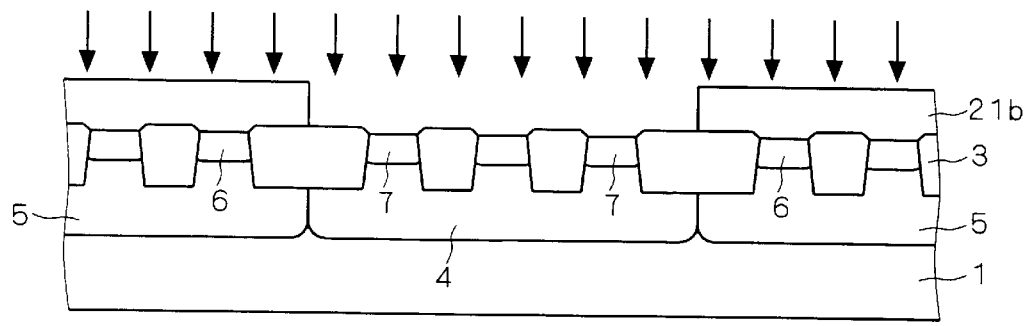
F I G. 1 2
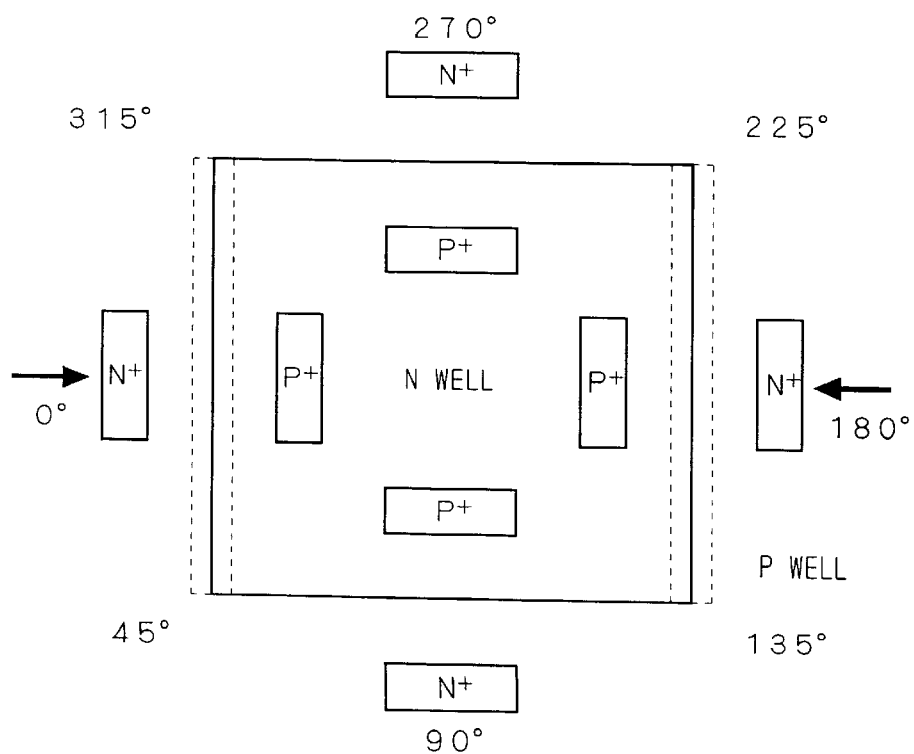

F I G. 23
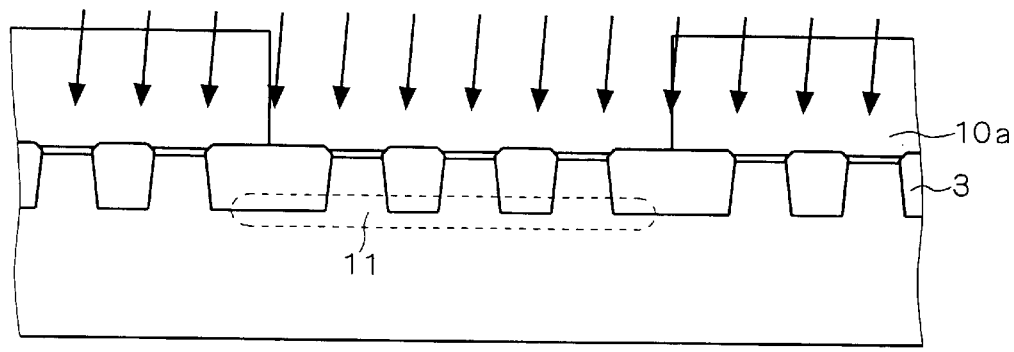
F I G. 24
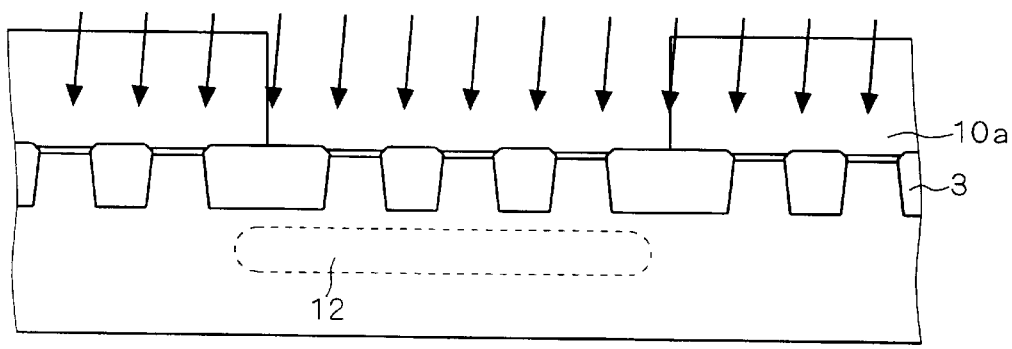
F I G. 25
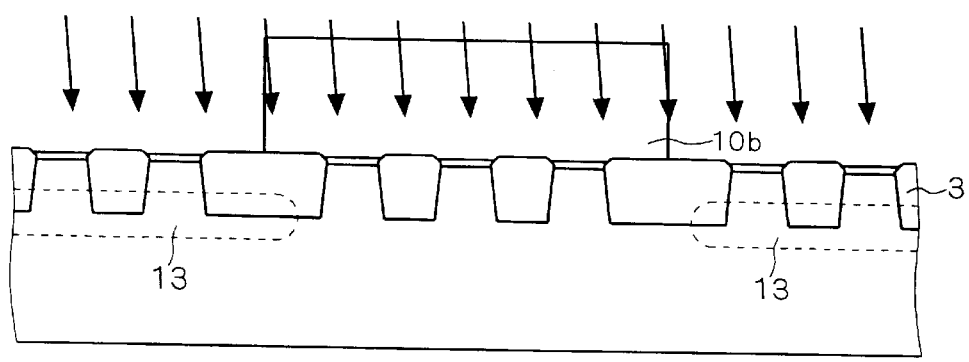

F I G. 30
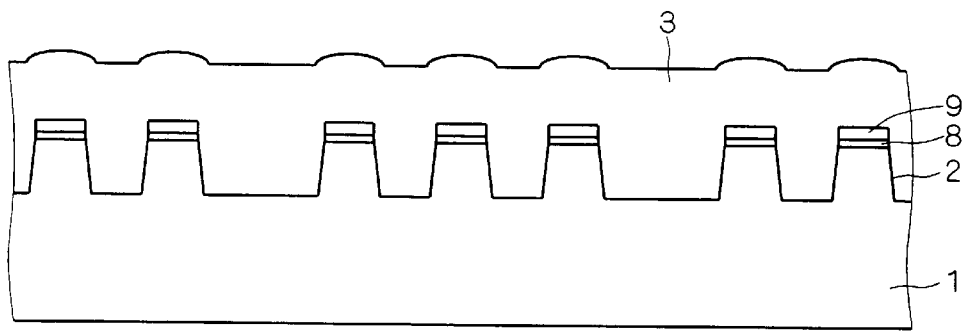
F I G. 31
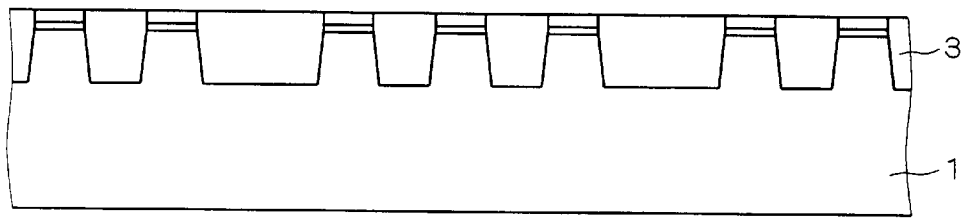
F I G. 32
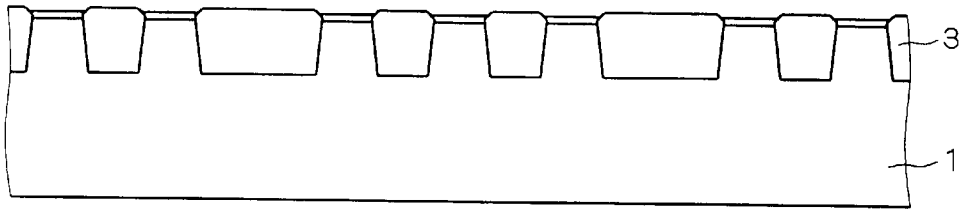
F I G. 33
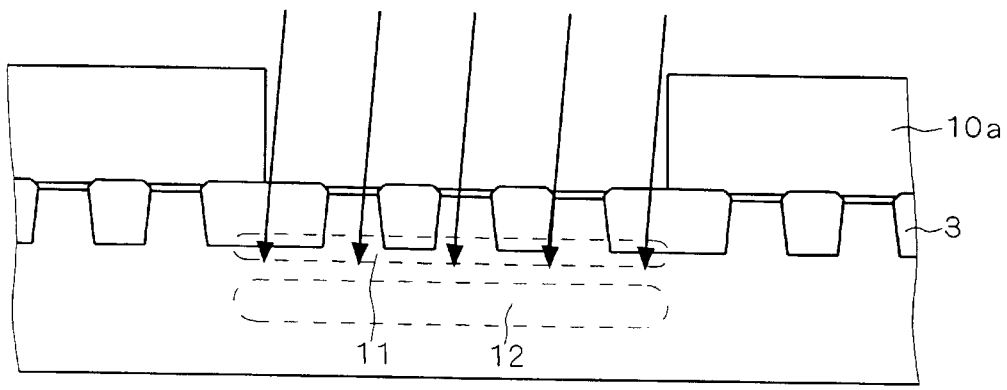

F I G. 37
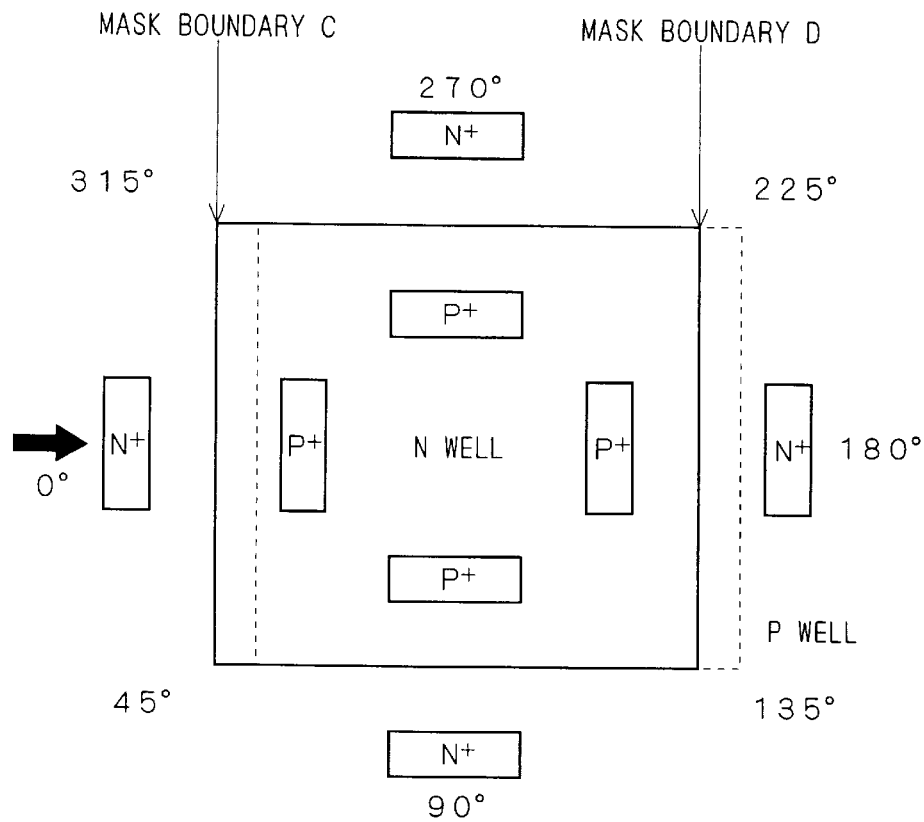
F I G. 38
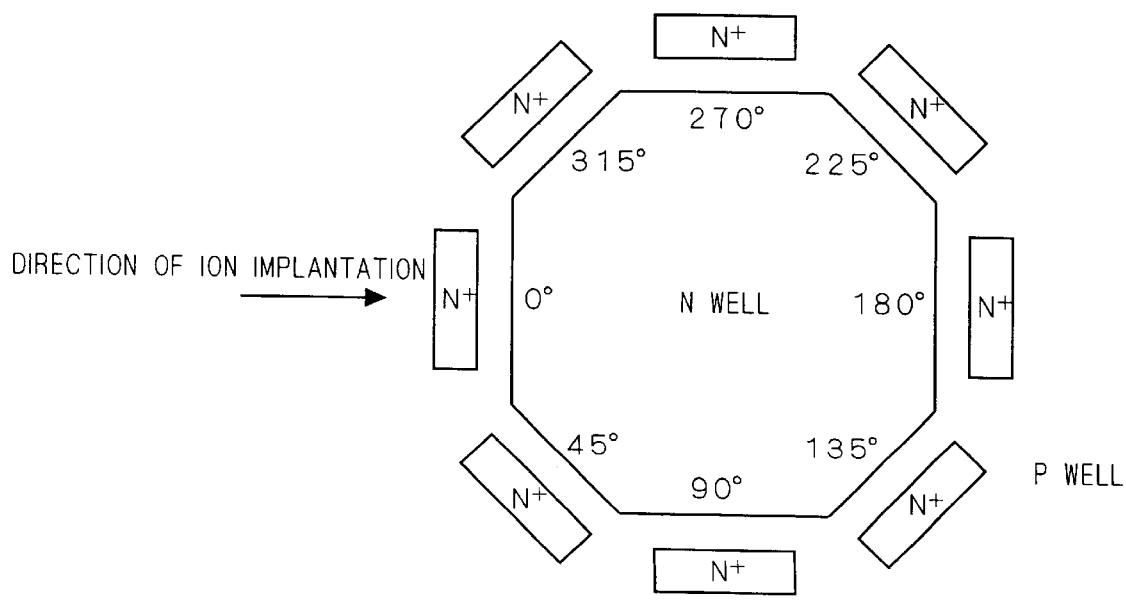

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of the Background Art

With a growing trend in recent years toward large-scale integration and miniaturization of semiconductor devices, it is becoming extremely important to reduce an isolation width between elements constituting a semiconductor device.

FIG. 28 is a sectional view showing a CMOS structure of a conventional semiconductor device. A semiconductor substrate 1 has an element isolation oxide film 3 formed in a predetermined region thereof. P wells 4 and N wells 5 are further formed in the semiconductor substrate 1. A PMOSFET formed on an N well 5 has a P type diffusion layer 6, and an NMOSFET formed on a P well 4 has an N type diffusion layer 7. Illustration of gate electrodes and the like of the PMOSFET and the NMOSFET is omitted here. The element isolation oxide film 3 electrically isolates P type diffusion layers 6 formed on N wells 5 from each other, and N type diffusion layers 7 formed on P wells 4 from each other, respectively. The element isolation oxide film 3 also electrically isolates a P well 4 from a P type diffusion layer 6 formed on an N well 5, and an N well 5 from an N type diffusion layer 7 formed on a P well 4, respectively.

Now in reference to FIGS. 29 through 34, an example of steps of manufacturing the CMOS structure of the semiconductor device shown in FIG. 28 will be described. First, an oxide film 8 is formed in a thickness of 10–30 nm on a main surface of the semiconductor substrate 1, and a nitride film 9 is deposited thereon by 100–200 nm. Thereafter, a photoresist (not shown) is formed and patterned so that an opening is provided in a region in which the element isolation oxide film 3 is to be formed, and the photoresist is used as a mask to perform anisotropic etching, thereby forming an element isolation groove 2 having a depth of 200–400 nm in the region in which the element isolation oxide film 3 is to be formed (FIG. 29). An oxide film to be the element isolation oxide film 3 is deposited thereon by 300–600 nm to fill in the element isolation groove 2 (FIG. 30). Next, the element isolation oxide film 3 is planarized by means of CMP, dry etching, wet etching, or combination of these methods, while removing the element isolation oxide film 3 on the nitride film 9 (FIG. 31). The nitride film 9 is finally removed, and the step of forming the element isolation oxide film 3 is completed (FIG. 32).

Next, a photoresist 10a is formed in a thickness of 1–3 μm and patterned so that an opening is provided in a region in which a P well 4 is to be formed. Then, boron which is a P type impurity ion is implanted at an acceleration voltage of 60 keV to 180 keV and at a dose of $2\times10^{12}$ to $2\times10^{13}/cm^2$, thereby forming a channel cut layer 11 for preventing punch-through between elements. Thereafter, boron is further implanted at an acceleration voltage of 200 keV to 1 MeV and at a dose of $4\times10^{12}$ to $4\times10^{13}/cm^2$, thereby forming a retrograde well 12 (FIG. 33). The impurity ion implantation is performed with an inclination (incident angle) of about 7 degrees for avoiding channeling. Further, doping is carried out for adjusting a threshold voltage at the NMOSFET, thereby forming the P well 4.

Subsequently, a resist 10b is formed in a thickness of 1–3 μm and patterned so that an opening is provided in a region in which an N well 5 is to be formed. Then, phosphor which is an N type impurity ion is implanted at an acceleration voltage of 120 keV to 380 keV and at a dose of $2\times10^{12}$ to $2\times10^{13}/cm^2$, thereby forming a channel cut layer 13 for preventing punch-through between elements. Thereafter, phosphor is implanted at an acceleration voltage of 400 keV to 2 MeV and at a dose of $4\times10^{12}$ to $4\times10^{13}/cm^2$, thereby forming a retrograde well 14 (FIG. 34). The implantation of phosphor is also performed with an inclination (incident angle) of about 7 degrees for avoiding channeling. Further, doping is carried out for adjusting a threshold voltage at the PMOSFET, thereby forming the N well 5.

Although illustration is omitted, a gate electrode, a P type diffusion layers 6 and an N type diffusion layers 7 are thereafter formed, and an interlayer insulating film, a contact hole and a wiring layer are further formed, thereby completing an LSI device.

As shown in FIG. 33, the impurity ion implantation to form the P well 4 is performed with an inclination of about 7 degrees. In this case, due to the shadowing effect caused by the height of the resist and the presence of an impurity ion flowing in below the resist 10a, impurity ion distributions to be formed actually (i.e., the channel cut layer 11 and the retrograde well 12) are shifted with respect to a position of an opening of the resist mask 10a. That is, the position of the P well 4 is shifted.

Further, as shown in FIG. 34, the impurity ion implantation to form the N well 5 is also performed with an inclination similarly to that for forming the P well 4, so that impurity ion distributions to be formed actually (i.e., the channel cut layer 13 and the retrograde well 14) are also shifted in the same direction as the P well 4. That is, the position of the N well 5 is also shifted in the same direction as the P well 4.

Therefore, according to the above-described method of manufacturing the conventional semiconductor device, the boundary between a P well 4 and an N well 5 is shifted with respect to the position of the opening of the resist mask 10a or 10b, i.e., a designed position. As a result, the distance between the N well 5 and the N type diffusion layer 7 in the P well 4 increases at a mask boundary A at the impurity ion implantation to form the wells, resulting in an increase in an isolation width (effective isolation width) which is actually effective therebetween, however, the distance between the P well 4 and the P type diffusion layer 6 in the N well 5 is reduced, which results in a reduction of an effective isolation width therebetween. On the other hand, the distance between the P well 4 and the P type diffusion layer 6 in the N well 5 increases at a mask boundary B, so that an effective isolation width therebetween increases, which, however, results in a reduction of an effective isolation width between the N well 5 and the N type diffusion layer 7 in the P well 4. That is, the effective isolation widths between the wells and the diffusion layers become unbalanced.

FIG. 36 shows design values dn0 and dp0 indicating isolation widths between the N well 5 and the N type diffusion layer 7 in the P well 4 at the mask boundaries A and B, respectively. The values dn+ and dn− indicate effective isolation widths between the N well 5 and the N type diffusion layer 7 in the P well 4 at the mask boundaries A and B, respectively. The values dp− and dp+ indicate effective isolation widths between the P well 4 and the N type diffusion layer 6 in the N well 5 at the mask boundaries A and B, respectively.

FIG. 37 is a plan view for explaining the aforementioned problem of the well shift. In the drawing, P+ represents the P type diffusion layer and N+ represents the N type diffusion layer. The left direction of the drawing is defined as a 0 degree direction. For instance, when the impurity ion implantation to form the N well is performed at an incident angle of about 7 degrees from the 0 degree direction using a resist having an opening in a position for the N well indicated by solid lines as a mask, the N well is formed with a shift from the position of the opening of the resist, i.e., the designed position, as indicated by dotted lines in FIG. 37. Further, by performing the impurity ion implantation to form the P well at an incident angle of about 7 degrees from the 0 degree direction, the P well is also formed with a shift from the designed position as indicated by the same dotted lines.

As a result, the effective isolation width between the P well and the P type diffusion layer in the N well at a boundary C shown in FIG. 37 and that between the N well and the N type diffusion layer in the P well at a boundary D both become smaller than designed values.

Alternatively, the N well and the P well shall be formed, for example, by the impurity ion implantation from the 0 degree direction in an arrangement of the N well, the P well and the N type diffusion layer such as that shown in FIG. 38. At this time, the N well and the P well are shifted in a 180 degree direction from the designed position, which increases the effective isolation width between the N well and the N type diffusion layer positioned in the 0 degree direction with respect to the N well, resulting in an improved breakdown voltage performance therebetween. On the other hand, the effective isolation width between the N well and the N type diffusion layer positioned in the 180 degree direction with respect to the N well is reduced, resulting in a reduction in a breakdown voltage performance therebetween. The effective isolation widths between the N well and the N type diffusion layer positioned in 90 degree direction and 270 degree direction with respect to the N well remain at designed values, respectively. The relationship between the direction (angle) in which the N type diffusion layer is positioned with respect to the N well and the breakdown voltage therebetween in this case is plotted by solid line in a graph shown in FIG. 40.

Still alternatively, the N well and the P well shall be formed, for example, by the impurity ion implantation from the 0 degree direction in an arrangement of the N well, the P well and the P type diffusion layer such as that shown in FIG. 39. At this time, the N well and the P well are also shifted in the 180 degree direction from the designed position, which reduces the effective isolation width between the P well and the P type diffusion layer positioned in the 0 degree direction in the N well, resulting in a reduction in a breakdown voltage performance therebetween. On the other hand, the effective isolation width between the P well and the P type diffusion layer positioned in the 180 degree direction in the N well is increased, resulting in an improved breakdown voltage performance therebetween. The effective isolation widths between the P well and the P type diffusion layer positioned in the 90 degree direction and the 270 degree direction in the N well remain at designed values, respectively. The relationship between the direction (angle) in which the P type diffusion layer is positioned in the N well and the breakdown voltage therebetween in this case is plotted by dotted line in the graph shown in FIG. 40.

More specifically, as seen from the graph shown in FIG. 40, the breakdown voltage characteristics, i.e., the isolation characteristics between the P well and the P type diffusion layer and between the N well and the N-well diffusion layer vary, depending on the relationship between the direction of the impurity ion implantation when forming the wells and the direction in which the diffusion layers are positioned with respect to the wells. This means that limiting the positional relationship between the wells and the diffusion layers only in such a manner that the isolation characteristics are most improved enables the most effective arrangement of the wells and the diffusion layers. However, it is virtually impossible to limit the direction of the diffusion layers with respect to the wells to a single direction, so that the minimum value of the isolation width, i.e., the minimum isolation width between the wells and the diffusion layers needs to be determined based on such an arrangement that the isolation characteristics between the wells and the diffusion layers become worst.

As has been described, degradation in the effective isolation width between the wells and the diffusion layers (degradation in the isolation characteristics) caused by impurity ion implantation for forming wells performed at a predetermined incident angle becomes a factor of hampering large-scale integration of a semiconductor device by reducing the isolation width between elements.

SUMMARY OF THE INVENTION

An object of the present invention is to provide a semiconductor device capable of suppressing degradation in the effective isolation width between a well and a diffusion layer caused by impurity ion implantation performed at a predetermined incident angle when forming the well, and a method of manufacturing the same.

According to a first aspect of the present invention, a semiconductor device includes an element isolation region and a well which is formed in an active region. The element isolation region is formed in a main surface of a semiconductor substrate and defines the active region. The well includes first and second impurity concentration peaks. The first impurity concentration peak is formed at a depth in the vicinity of a bottom of the element isolation region. The second impurity concentration peak is formed in a position deeper than the first impurity concentration peak. The first impurity concentration peak and the second impurity concentration peak are positionally shifted relative to each other in two directions different from each other in a plan view.

According to a second aspect of the present invention, a semiconductor device includes an element isolation region, a P well and an N well. The element isolation region is formed in a main surface of a semiconductor substrate and defines first and second active regions. The P well is formed in the first active region and shifted in a first direction relative to a depth direction of the semiconductor substrate. The N well is formed in the second active region and shifted in a second direction relative to the depth direction of the semiconductor substrate. The first and second directions are different from each other by 180 degrees in a plan view.

The unbalance of the isolation characteristics caused by the directional relationship between the wells and diffusion layers is reduced, and there can be no direction that the isolation characteristics are extremely degraded, which can contribute to large-scale integration of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 through 11 are sectional views showing manufacturing steps of the semiconductor device according to the first preferred embodiment;

FIGS. 12 through 15 are plan views showing the effect achieved by the method of manufacturing the semiconductor device according to the first preferred embodiment;

FIG. 23 is a sectional view showing a CMOS structure of a semiconductor device according to a third preferred embodiment of the invention;

FIGS. 24 through 27 are sectional views showing manufacturing steps of the semiconductor device according to the third preferred embodiment;

FIGS. 29 through 34 are sectional views showing manufacturing steps of the conventional semiconductor device;

FIGS. 37 through 39 are plan views explaining the problem of the shift of the wells in the conventional semiconductor device.

DESCRIPTION OF THE PREFERRED EMBODIMENTS

<First Preferred Embodiment>

Figure 1:
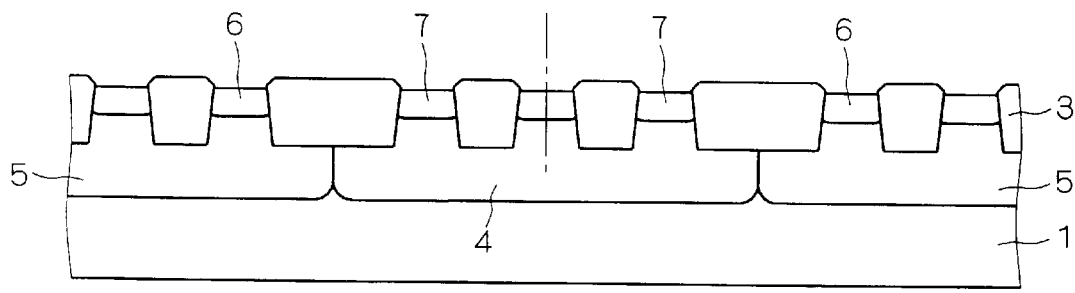
FIGS. 1 and 2 are sectional views showing a CMOS structure of a semiconductor device according to a first preferred embodiment of the invention.
Figure 2:
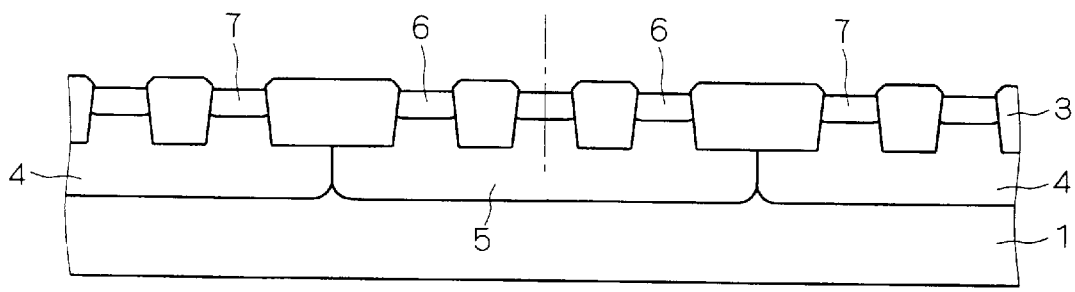

FIGS. 1 and 2 are sectional views showing a CMOS structure of a semiconductor device according to the first preferred embodiment of the present invention. As shown in the drawings, the element isolation oxide film 3 is formed in a predetermined region of the semiconductor substrate 1. P wells 4 and N wells 5 are further formed in the semiconductor substrate 1. A PMOSFET formed on an N well 5 has a P type diffusion layer 6, and an NMOSFET formed on a P well 4 has an N type diffusion layer 7. Illustration of gate electrodes and the like of the PMOSFET and the NMOSFET is omitted here.

Figure 35:
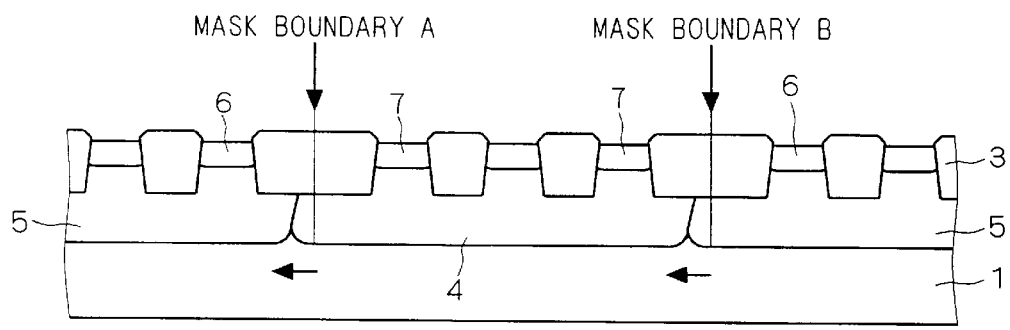
FIGS. 35 and 36 are sectional views showing shifts of wells formed by the manufacturing steps of the conventional semiconductor device.
Figure 36:
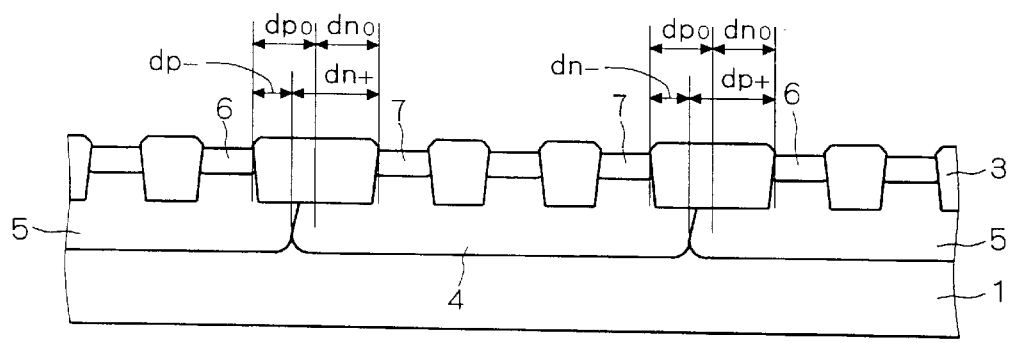
Figure 39:
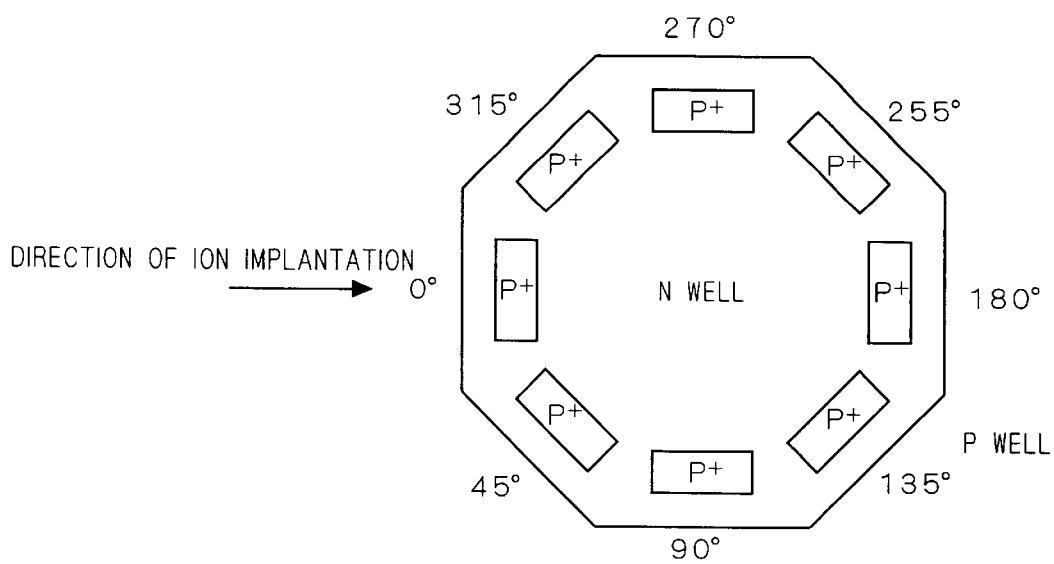
Figure 40:
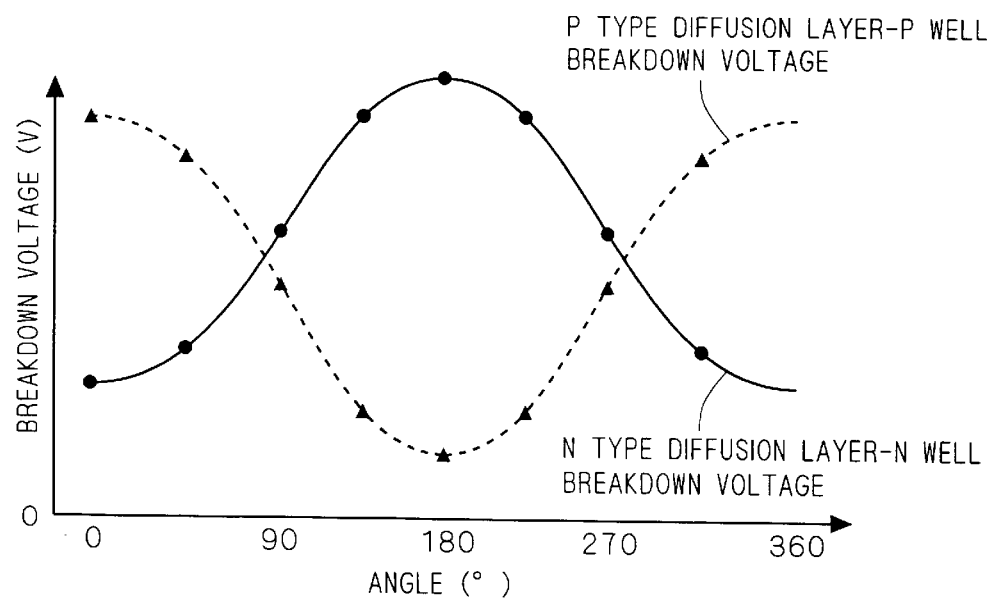
FIG. 40 is a graph showing the relationship between the direction in which diffusion layers are positioned with respect to wells and the breakdown voltage between the diffusion layers and the wells in the conventional semiconductor device.

The element isolation oxide film 3 electrically isolates P type diffusion layers 6 formed on N wells 5 from each other, and N type diffusion layers 7 formed on P wells 4 from each other, respectively. The element isolation oxide film 3 also electrically isolates a P well 4 from a P type diffusion layer 6 formed on an N well 5, and an N well 5 from an N type diffusion layer 7 formed on a P well 4, respectively. In the present embodiment, the boundary between an N well 5 and a P well 4 is not shifted as in the conventional semiconductor device shown in FIGS. 35 and 36, but is in agreement with its designed position.

The manufacturing steps of the semiconductor device shown in FIGS. 1 and 2 will be described now. First, the element isolation oxide film 3 is formed in a predetermined region on the main surface of the semiconductor substrate 1 by the same process in the manufacturing steps of the conventional semiconductor device shown in FIGS. 29 through 32.

Figure 3:
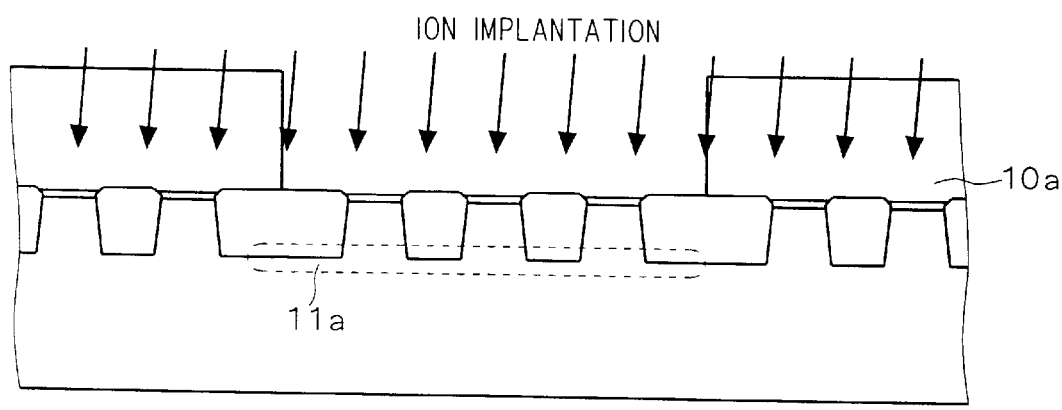
Figure 4:
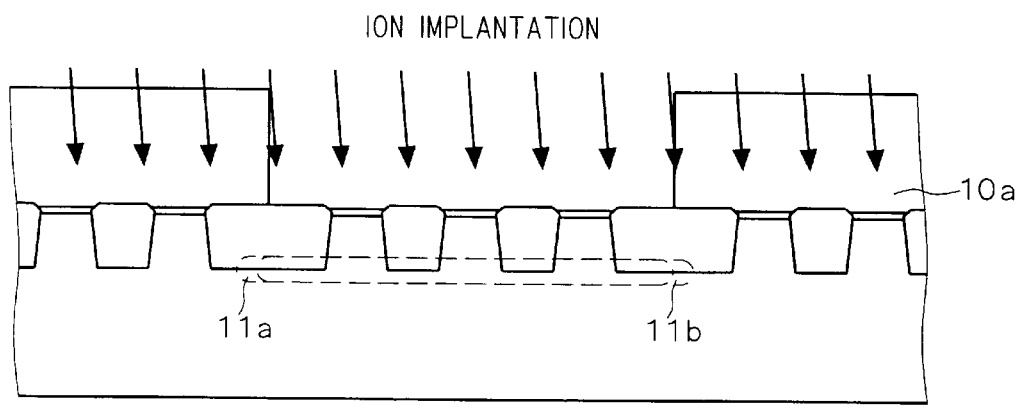

Next, the photoresist 10a is formed in a thickness of 1–3 μm and patterned so that an opening is provided in a region in which the P well 4 is to be formed. Then, boron which is a P type impurity ion is implanted from a first direction at an acceleration voltage of 60 keV to 180 keV and at a dose of $1\times10^{12}$ to $1\times10^{13}/cm^2$ (that is, at the same acceleration voltage and at half the dose for forming the conventional channel cut layer 11) with an inclination (incident angle) of 2 to 9 degrees, thereby forming a first channel cut layer 11a (FIG. 3). Next, boron is further implanted from a second direction different from the first direction by 180 degrees in a plan view at the same acceleration voltage, dose and incident angle as those for forming the channel cut layer 11a, thereby forming a second channel cut layer 11b (FIG. 4). That is, the channel cut layers are formed by impurity ion implantation from two directions different from each other by 180 degrees in a plan view.

Figure 5:
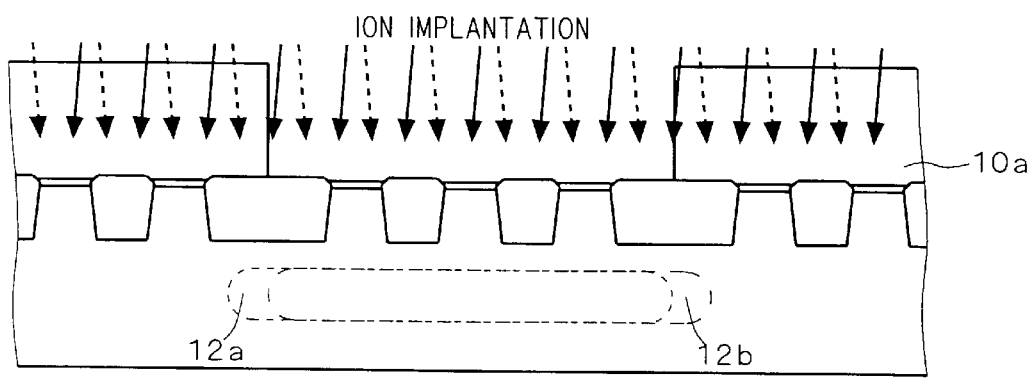

Further, boron is implanted from the first direction at an acceleration voltage of 200 keV to 1 MeV and at a dose of $2\times10^{12}$ to $2\times10^{13}/cm^2$ (that is, at the same acceleration voltage and at half the dose for forming the conventional retrograde well 12) with an inclination (incident angle) of 2 to 9 degrees, thereby forming a first retrograde well 12a. Thereafter, boron is further implanted from the second direction at the same acceleration voltage, dose and incident angle as those for forming the first retrograde well 12a, thereby forming a second retrograde well 12b (FIG. 5). That is, the retrograde wells are formed by the impurity ion implantation from the two directions different from each other by 180 degrees in a plan view.

Then, doping is carried out for adjusting a threshold voltage at the NMOSFET, thereby forming the P well 4. As described above, the P well 4 is formed by the ion implantation from the two directions, i.e., the first and the second directions different from each other by 180 degrees. As a result, the P well 4 has a form expanded toward the first and the second directions with respect to the depth direction of the semiconductor substrate 1.

Figure 6:
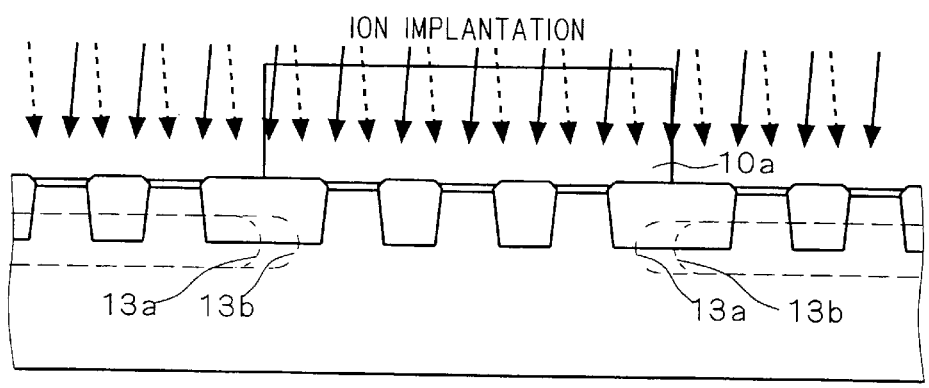

Subsequently, the resist 10b is formed and patterned so that an opening is provided in a region in which the N well 5 is to be formed. Then, phosphor which is an N type impurity ion is implanted from the first direction at an acceleration voltage of 120 keV to 380 keV and at a dose of $1\times10^{12}$ to $1\times10^{13}/cm^2$ (that is, at the same acceleration voltage and at half the dose for forming the conventional channel cut layer 13) with an inclination (incident angle) of 2 to 9 degrees, thereby forming a first channel cut layer 13. Thereafter, phosphor is further implanted from the second direction at the same acceleration voltage, dose and incident angle as those for forming the first channel cut layer 13a, thereby forming a second channel cut layer 13b (FIG. 6). That is, the channel cut layers are formed by the impurity ion implantation from the two directions different from each other by 180 degrees in a plan view.

Figure 7:
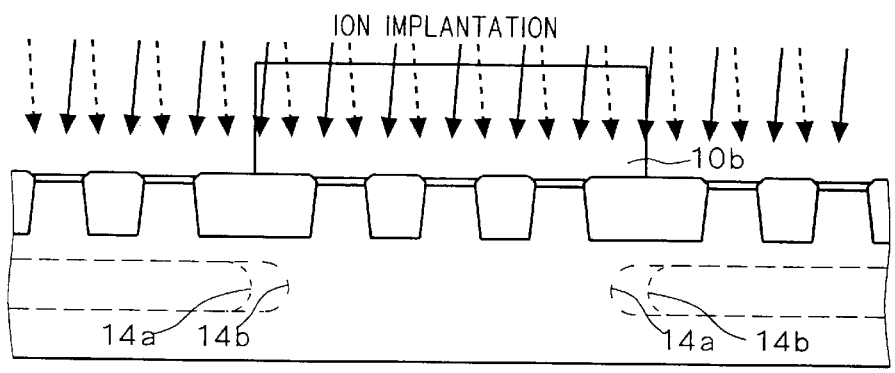

Further, phosphor is implanted from the first direction at an acceleration voltage of 400 keV to 2 MeV and at a dose of $2\times10^{12}$ to $2\times10^{13}/cm^2$ (that is, at the same acceleration voltage and at half the dose for forming the conventional retrograde well 14) with an inclination (incident angle) of 2 to 9 degrees, thereby forming a first retrograde well 14a. Thereafter, phosphor is further implanted from the second direction at the same acceleration voltage, dose and incident angle as those for forming the first retrograde well 14a, thereby forming a second retrograde well 14b (FIG. 7). That is, the retrograde wells are formed by the impurity ion implantation from the two directions different from each other by 180 degrees in a plan view.

Next, doping is carried out for adjusting a threshold voltage at the PMOSFET, thereby forming the N well 5. As described above, the N well 5 is formed by the ion implantation from the two directions, i.e., the first and the second directions different from each other by 180 degrees. As a result, the N well 5 has a form expanded toward the first and the second directions with respect to the depth direction of the semiconductor substrate 1.

Figure 8:
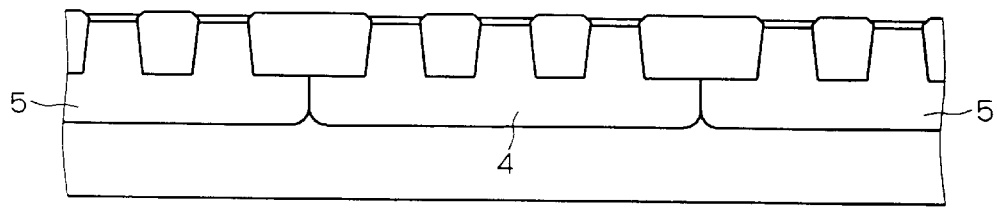

As has been described, shifts of the P well 4 and the N well 5 as formed occur both in the first and the second directions, however, the shifts are cancelled out by each other at the boundary between the P well and the N well adjacent to each other. As a result, there can be no shift at a boundary between the completed P well and N well, as shown in FIG. 8.

Figure 9:
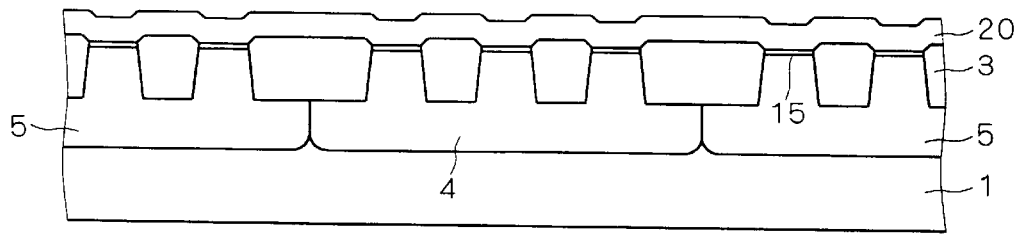

Next, after removing the oxide film in the active region, a gate insulating film 15 is formed in a thickness of 1–10 nm and a gate electrode 20 is deposited by 100–200 nm (FIG. 9). Although illustration is omitted, the gate electrode 20 is thereafter patterned to form a gate sidewall as necessary.

Figure 10:
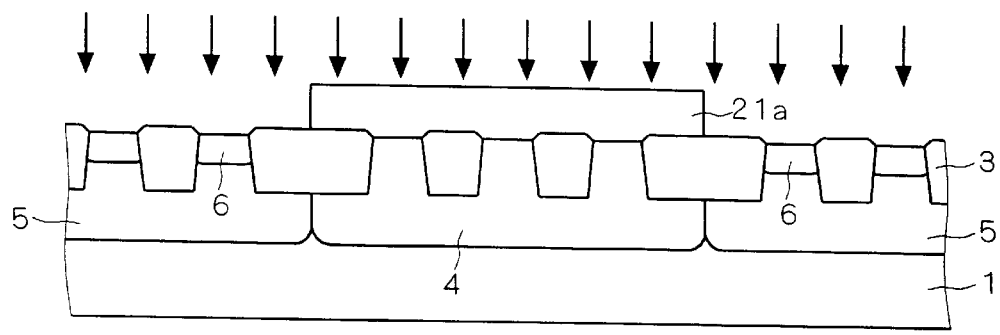

Next, a resist 21a is formed and patterned so that an opening is provided in a region in which the P type diffusion layer 6 is to be formed. Then, boron is implanted at an acceleration voltage of 1 to 10 keV and at a dose of $1\times10^{15}$ to $1\times10^{16}/cm^2$, thereby forming the P type diffusion layer 6 on the N well 5 (FIG. 10). Next, a resist 21b is formed and patterned so that an opening is provided in a region in which the N type diffusion layer 7 is to be formed. Then, arsenic is implanted at an acceleration voltage of 20 to 100 keV and at a dose of $1\times10^{15}$ to $1\times10^{16}/cm^2$, thereby forming the N type diffusion layer 7 on the P well 4 (FIG. 11). Heat treatment is conducted as necessary in the above steps. Although illustration is omitted, an interlayer insulating film, a contact hole, a wiring layer and the like are further formed, thereby completing an LSI device.

According to the aforementioned steps, the shifts of the P well 4 and the N well 5 occur toward the first direction and the second direction different from the first direction by 180 degrees in a plan view. The shifts are cancelled out by each other at the boundary between the P well and the N well adjacent to each other. Thus, the boundary between the P well and the N well remains at the designed position, so that the effective isolation width is prevented from becoming unbalanced, thereby suppressing degradation in the effective isolation width.

The impurity ion implantation for forming the wells is performed twice, respectively, one from the first direction and the other from the second direction. For instance, in the case that the N well and the P well are formed in an arrangement such as that shown in FIG. 12 by the steps described above in the present embodiment by impurity ion implantation separately performed from the 0 degree direction and from the 180 degree direction, the N well and the P well are shifted toward the 0 degree direction and the 180 degree direction, respectively, as shown in the drawing. However, each impurity ion implantation is performed at half the dose in impurity ion implantation which has conventionally been performed once. Thus, the amount of the shifts of the wells is equivalent to substantially half that in the conventional semiconductor device shown in FIG. 37 as indicated by dotted lines of FIG. 12. Therefore, the effective isolation width between the N well and the N type diffusion layer in the P well and that between the P well and the P type diffusion layer in the N well are prevented from being degraded compared to the conventional semiconductor device.

Figure 13:
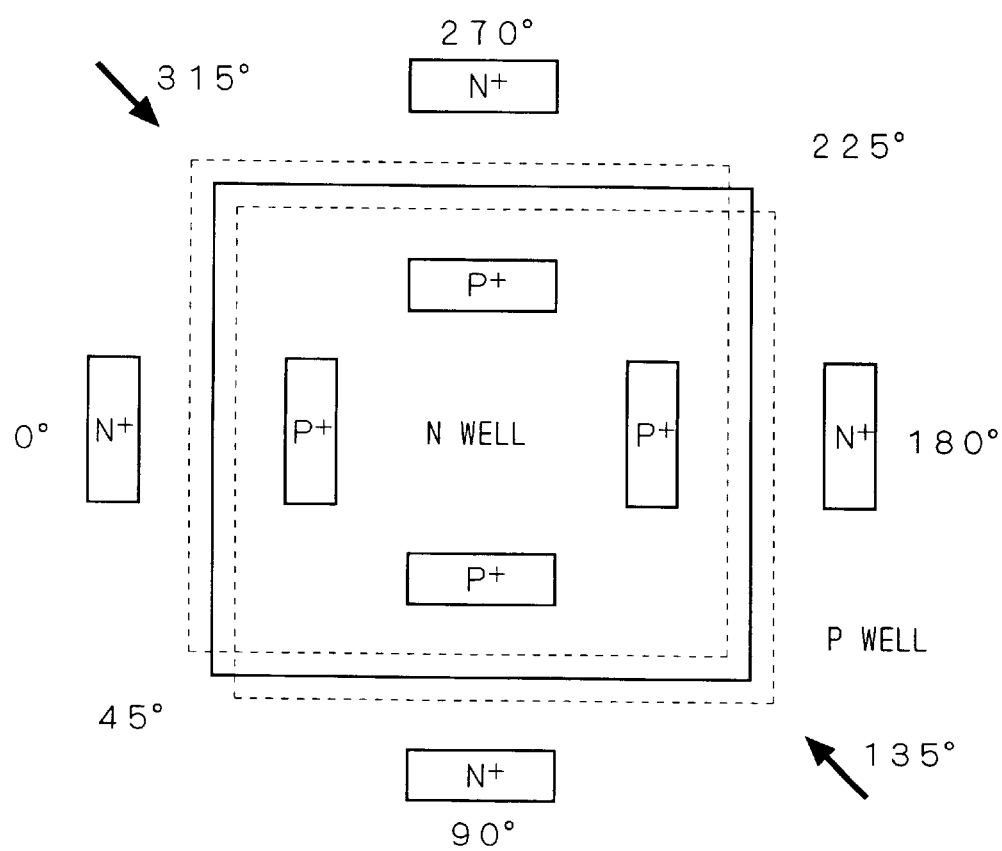

FIG. 13 shows the case that the first and the second directions in which ions are implanted are set in 45 degrees with respect to each boundary between the wells in the same pattern as shown in FIG. 12. In this case, the amount of shifts of the wells in the vertical direction and the lateral direction is reduced compared to the case shown in FIG. 12, and there can be no direction that the isolation characteristics with respect to the wells are particularly degraded. In other words, the isolation characteristics in a direction which are at the worst become improved. This means that the minimum isolation width can be made still smaller than that in the conventional semiconductor device, since, as described above, in a practical semiconductor integrated circuit design, the minimum isolation width between a well and a diffusion layer needs to be determined based on an arrangement in which the isolation characteristics are at the worst. That is, it is possible to contribute to large-scale integration of a semiconductor device.

In other words, the wells are limited to a polygonal form constituted by sides which form an angle of 45 degrees with the directions of impurity ion implantation for forming the wells, so that the degradation in the isolation characteristics is effectively suppressed and there can be no direction that the isolation characteristics are particularly degraded.

Figure 14:
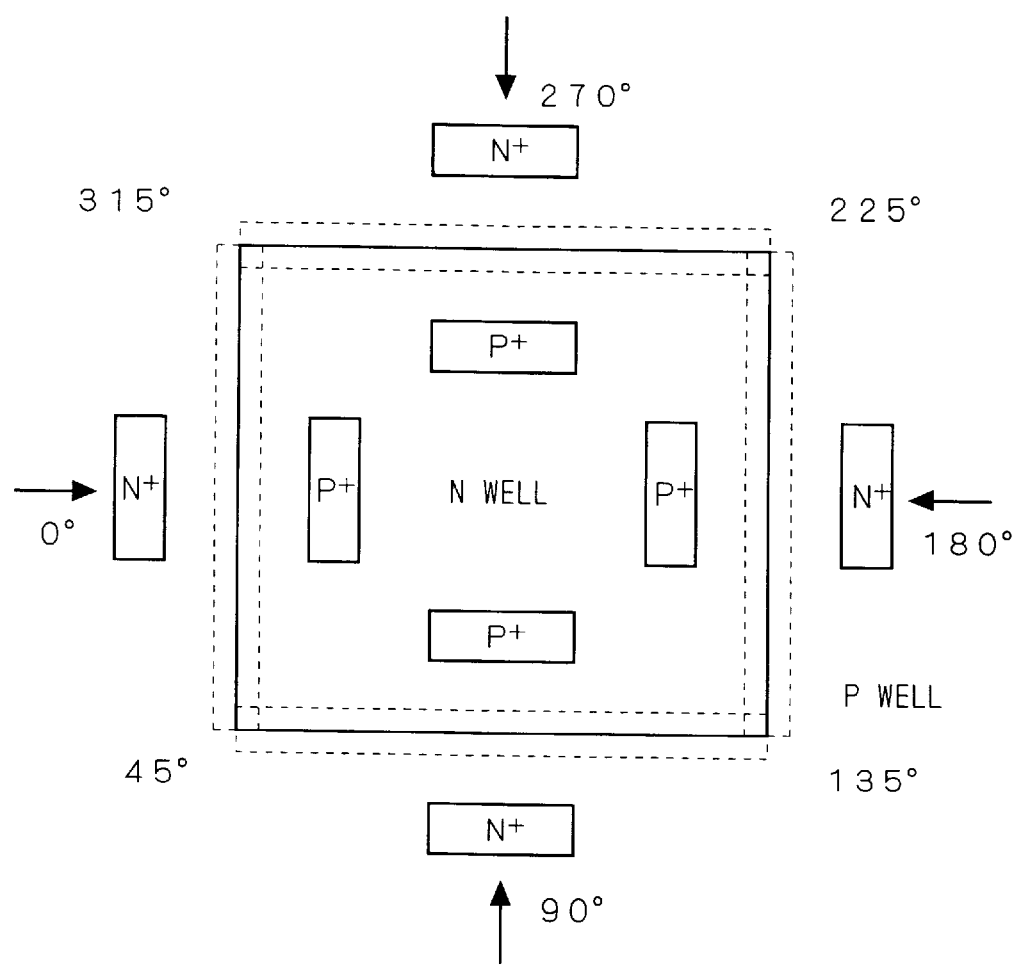

In the above described manufacturing steps of the semiconductor device according to the present embodiment, although impurity ion implantation is performed twice from two directions different from each other by 180 degrees in a plan view at half the dose in the manufacturing steps of the conventional semiconductor device, it may be performed four times from four directions different from each other by 90 degrees as shown in FIG. 14. In that case, however, each impurity ion implantation is performed at one quarter of the dose in the manufacturing steps of the conventional semiconductor device. The wells formed in this case each have a form expanded toward four directions different from each other by 90 degrees with respect to the depth direction of the semiconductor substrate 1.

As shown in FIGS. 12 and 14, performing impurity ion implantation four times from the four directions different from each other by 90 degrees makes it possible to limit the amount of the shifts of the wells to half that in the case of performing impurity ion implantation twice from two directions different from each other by 180 degrees. That is, it is possible to further suppress degradation in the effective isolation width between the wells and the diffusion layers. In this case, there can be no specific direction that the isolation characteristics between the wells and the diffusion layers are degraded if the wells have a rectangular form.

Figure 15:
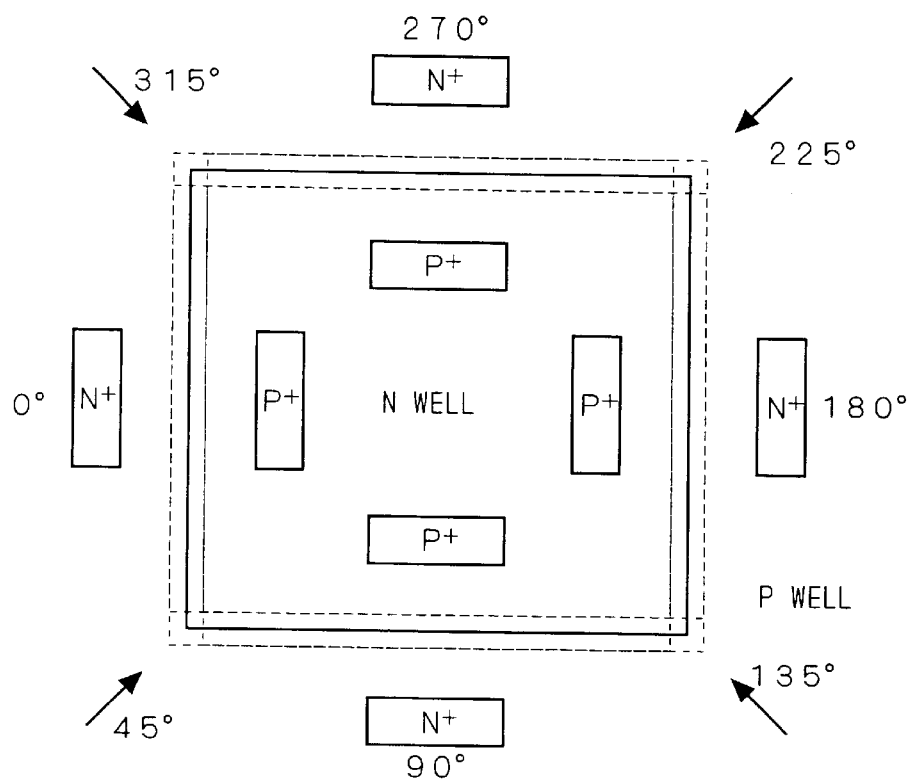

Further, as shown in FIG. 15, in the case that impurity ion implantation is performed four times from directions forming an angle of 45 degrees with respect to each boundary between the wells, the amount of vertical and lateral shifts of the wells is particularly limited. In other words, by limiting the well to a polygonal form constituted by sides which form an angle of 45 degrees with the direction of impurity ion implantation for forming the wells, degradation in the isolation characteristics can effectively be suppressed.

Although the above description has been directed to a structure in which a well has two impurity concentration peaks (a channel cut layer and a retrograde well) in deep positions in the substrate of the semiconductor device, the present invention is not limited to such a scope of application, but is widely applicable to a well having one or more impurity concentration peaks.

<Second Preferred Embodiment>

Figure 16:
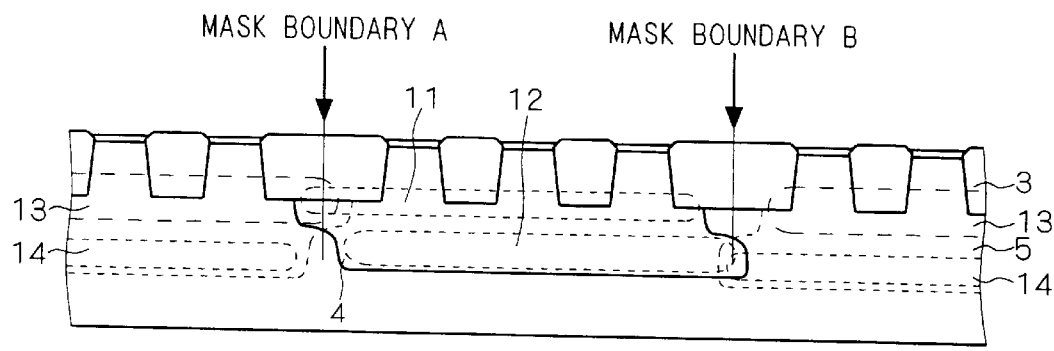
FIG. 16 is a sectional view showing a CMOS structure of a semiconductor device according to a second preferred embodiment of the invention.

FIG. 16 is a sectional view showing a CMOS structure of a semiconductor device according to the second preferred embodiment of the present invention. As shown in the drawing, the element isolation oxide film 3 is formed in a predetermined region of the semiconductor substrate 1. P wells 4 and N wells 5 are further formed in the semiconductor substrate 1. A PMOSFET formed on an N well 5 has a P type diffusion layer 6, and an NMOSFET formed on a P well 4 has an N type diffusion layer 7. Illustration of gate electrodes and the like of the PMOSFET and the NMOSFET is omitted here.

The element isolation oxide film 3 electrically isolates P type diffusion layers 6 formed on N wells 5 from each other, and N type diffusion layers 7 formed on P wells 4 from each other, respectively. The element isolation oxide film 3 also electrically isolates a P well 4 from a P type diffusion layer 6 formed on an N well 5, and an N well 5 from an N type diffusion layer 7 formed on a P well 4, respectively.

In the present embodiment, a P well 4 and an N well 5 each have two impurity concentration peaks: a channel cut layer in the vicinity of a bottom of the element isolation oxide film 3; and a retrograde well in a position deeper than the channel cut layer. As shown in FIG. 16, the channel cut layer 11 and the retrograde well 12 of the P well 4 are both shifted from the mask boundaries A and B (i.e., designed positions for boundaries between the wells) at the impurity ion implantation to form the wells. However, the channel cut layer 11 and the retrograde well 12 are shifted in directions different from each other by 180 degrees. Likewise, the channel cut layer 13 and the retrograde well 14 of the N well 5 are shifted in directions different from each other by 180 degrees.

Now referring to FIGS. 17 through 20, manufacturing steps of the semiconductor device according to the present embodiment will be described. First, the element isolation oxide film 3 is formed in a predetermined region of the semiconductor substrate 1 by the same process in the manufacturing steps of the conventional semiconductor device shown in FIGS. 29 through 32.

Figure 17:
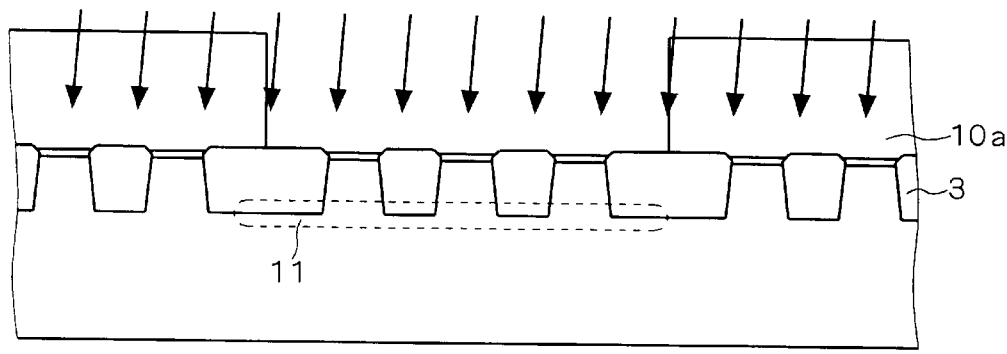
FIGS. 17 through 22 are sectional views showing manufacturing steps of the semiconductor device according to the second preferred embodiment.

Next, the photoresist 10a is formed in a thickness of 1–3 $\mu$m and patterned so that an opening is provided in a region in which the P well 4 is to be formed. Then, boron which is a P type impurity ion is implanted at an acceleration voltage of 60 keV to 180 keV and at a dose of $2\times10^{12}$ to $2\times10^{13}/cm^2$ from the first direction with an inclination of 2 to 9 degrees, thereby forming the channel cut layer 11 (FIG. 17).

Figure 18:
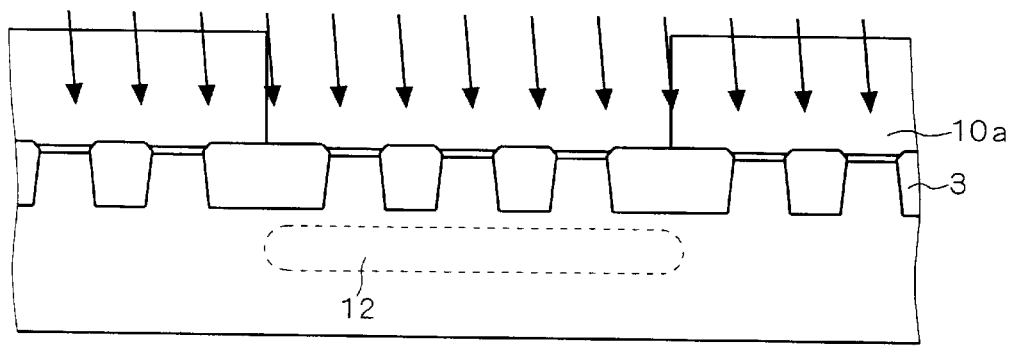

Next, boron is implanted at an acceleration voltage of 200 keV to 1 MeV and at a dose of $4\times10^{12}$ to $4\times10^{13}/cm^2$ from the second direction different from the first direction by 180 degrees with an inclination of 2 to 9 degrees, thereby forming the retrograde well 12 (FIG. 18). Then, doping is carried out for adjusting a threshold voltage at the NMOSFET, thereby forming the P well 4.

Figure 19:
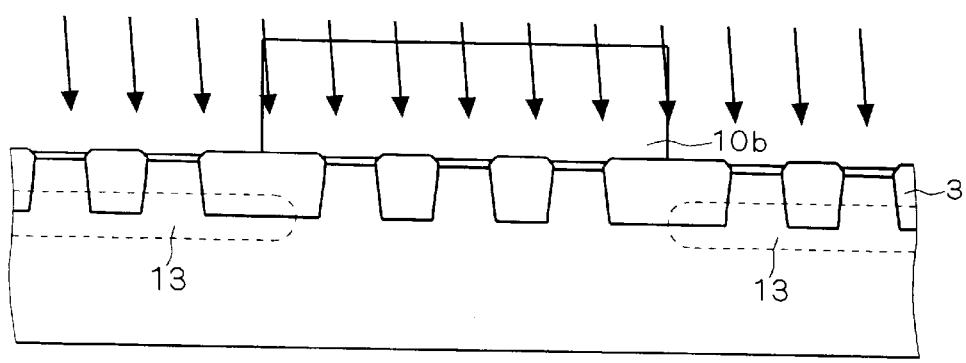

Subsequently, the resist 10b is formed and patterned so that an opening is provided in a region in which the N well 5 is to be formed. Then, phosphor which is an N type impurity ion is implanted at an acceleration voltage of 120 keV to 380 keV and at a dose of $2\times10^{12}$ to $2\times10^{13}/cm^2$ from the second direction with an inclination of 2 to 9 degrees, thereby forming the channel cut layer 13 (FIG. 19).

Figure 20:
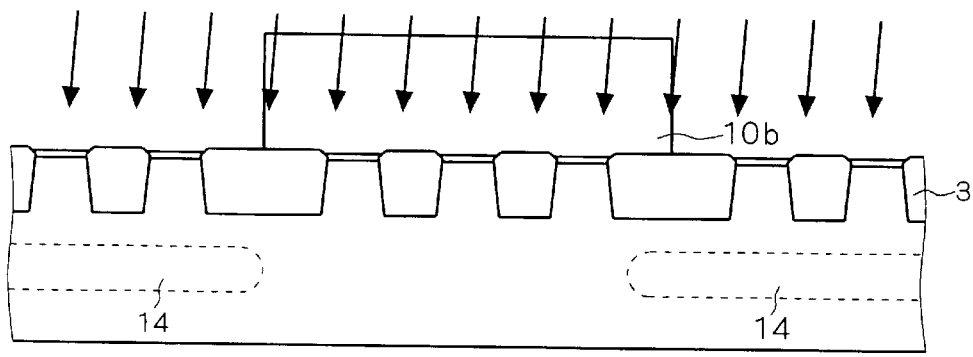

Next, phosphor is implanted at an acceleration voltage of 400 keV to 2 MeV and at a dose of $4\times10^{12}$ to $4\times10^{13}/cm^2$ from the first direction with an inclination of 2 to 9 degrees, thereby forming the retrograde well 14 (FIG. 20). Further, doping is carried out for adjusting a threshold voltage at the PMOSFET, thereby forming the N well 5. The P well 4 and the N well 5 are completed in this way.

The gate electrode, the P type diffusion layer 6 and the N type diffusion layer 7 are formed by the same method shown in FIGS. 9 to 11. An interlayer insulating film, a contact hole and a wiring layer are further formed, thereby completing an LSI device.

Figure 28:
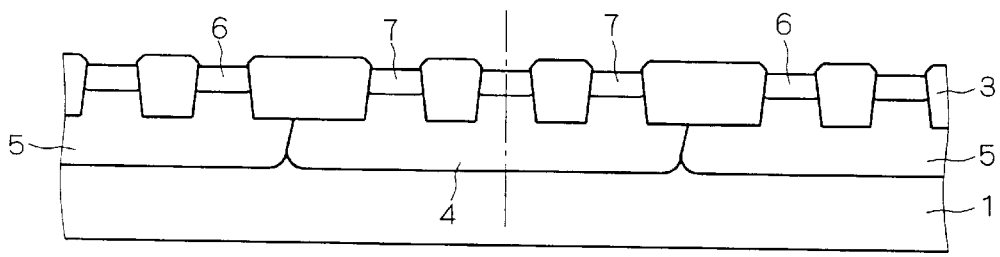
FIG. 28 is a sectional view showing a CMOS structure of a conventional semiconductor device.
Figure 29:
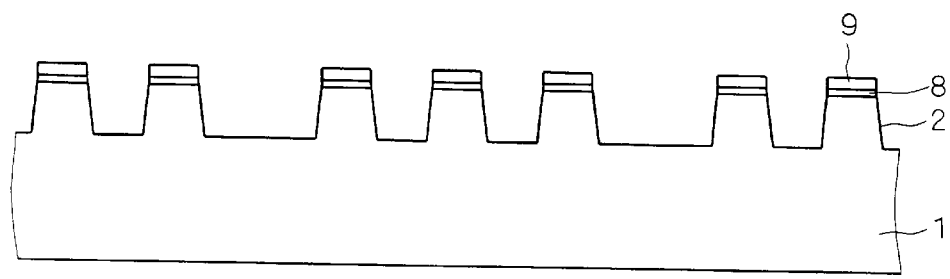
Figure 34:
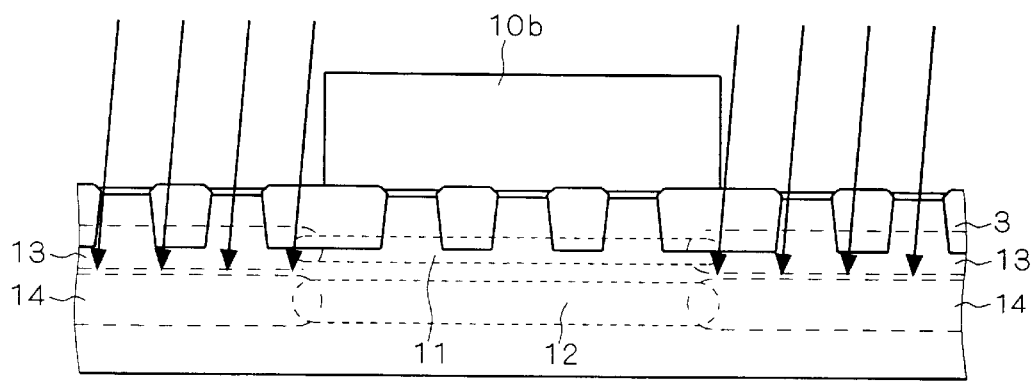

Since the channel cut layer 11 and the retrograde well 12 of the P well 4 are shifted in two directions different from each other by 180 degrees from the designed position of the P well 4, the shift of the P well 4 is reduced compared to the case that the channel cut layer 11 and the retrograde well 12 of the P well 4 are shifted in the same direction in the conventional semiconductor device shown in FIG. 28. Therefore, the isolation characteristics between the P well 4 and the P type diffusion layer 6 in the N well 5 is improved compared to that in the conventional semiconductor device.

Since the channel cut layer 13 and the retrograde well 14 of the N well 5 are likewise shifted in two directions different from each other by 180 degrees from the designed position of the N well 5, the shift of the P well 5 is reduced compared to the case that the channel cut layer 13 and the retrograde well 14 of the N well are shifted in the same direction in the conventional semiconductor device. Therefore, the isolation characteristics between the N well 5 and the N type diffusion layer 7 in the P well 4 is improved compared to that in the conventional semiconductor device.

Figure 21:
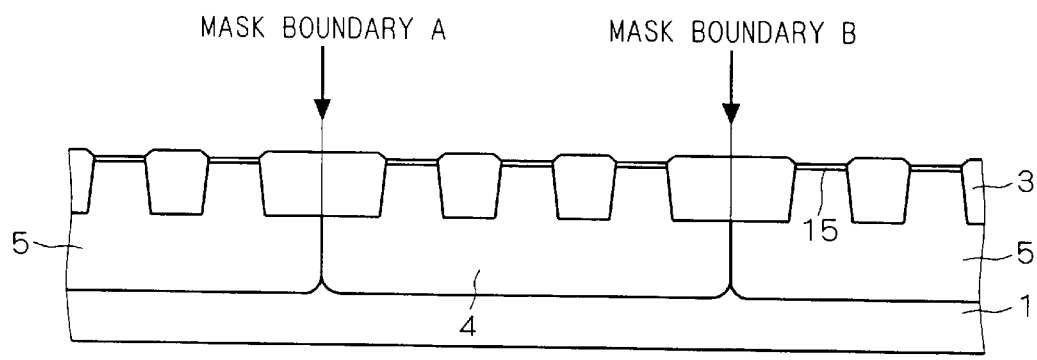

Further, in the manufacturing steps of the semiconductor device according to the present embodiment, impurity ion implantation to form the channel cut layer 11 of the P well 4 and the channel cut layer 13 of the N well 5 are performed from directions different from each other by 180 degrees in a plan view as shown in FIGS. 17 and 19. Thus, shifts of a P well 4 and an N well 5 adjacent to each other are cancelled out by each other. Further, by performing impurity ion implantation to form the retrograde well 12 of the P well 4 and the retrograde well 14 of the N well 5 from directions different from each other by 180 degrees in a plan view as shown in FIGS. 18 and 20, shifts of a P well 4 and an N well 5 adjacent to each other are cancelled out by each other. That is, it can be said that the P well 4 and the N well 5 shown in FIG. 17 are equivalent to those shown in FIG. 21 in which the shift of the well boundary is suppressed. Therefore, the effective isolation width in the wells is prevented from becoming unbalanced, thereby suppressing degradation in the effective isolation width.

In the present embodiment as well, the wells are limited to a polygonal form constituted by sides which form an angle of 45 degrees with the directions in which impurity ions are implanted when forming the wells, so that the degradation in the isolation characteristics is effectively suppressed and there can be no direction that the isolation characteristics are particularly degraded.

<Third Preferred Embodiment>

Figure 22:
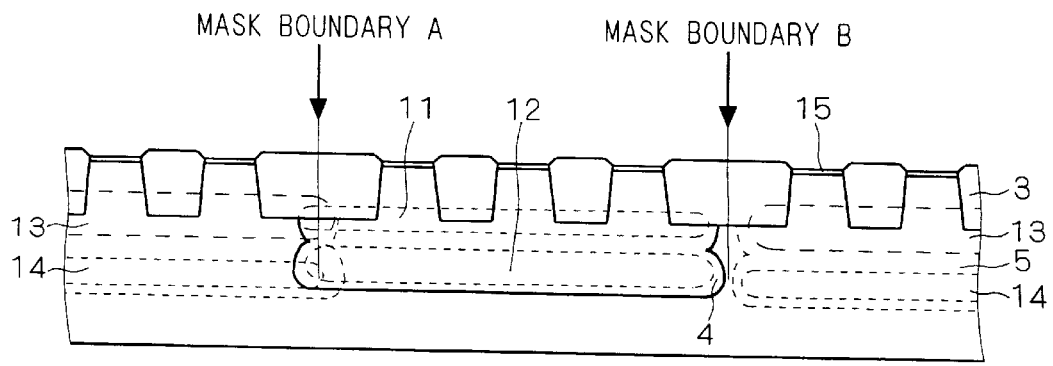

FIG. 22 is a sectional view showing a CMOS structure of a semiconductor device according to the third preferred embodiment of the present invention. As shown in the drawing, the element isolation oxide film 3 is formed in a predetermined region of the semiconductor substrate 1. P wells 4 and N wells 5 are further formed in the semiconductor substrate 1. A PMOSFET formed on an N well 5 has a P type diffusion layer 6, and an NMOSFET formed on a P well 4 has an N type diffusion layer 7. Illustration of gate electrodes and the like of the PMOSFET and the NMOSFET is omitted here.

The element isolation oxide film 3 electrically isolates P type diffusion layers 6 formed on N wells 5 from each other, and N type diffusion layers 7 formed on P wells 4 from each other, respectively. The element isolation oxide film 3 also electrically isolates a P well 4 from a P type diffusion layer 6 formed on an N well 5, and an N well 5 from an N type diffusion layer 7 formed on a P well 4, respectively.

In the present embodiment, a P well 4 and an N well 5 each have two impurity concentration peaks: a channel cut layer in the vicinity of the bottom of the element isolation oxide film 3; and a retrograde well in a position deeper than the channel cut layer. As shown in FIG. 22, the channel cut layer 11 and the retrograde well 12 of the P well 4, and the channel cut layer 13 and the retrograde well 14 of the N well 5 are shifted from the mask boundaries A and B (i.e., designed positions for boundaries between the wells) at the impurity ion implantation to form the wells. The channel cut layer 11 and the retrograde well 12 are shifted in the same direction. The channel cut layer 13 and the retrograde well 14 of the N well 5 are both shifted in a direction different from that of the shift of the channel layer 11 and the retrograde well 12 by 180 degrees in a plan view. That is, the P well 4 and the N well 5 are shifted in directions different from each other by 180 degrees.

Now referring to FIGS. 23 to 26, manufacturing steps of the semiconductor device according to the present embodiment will be described. First, the element isolation oxide film 3 is formed in a predetermined region of the semiconductor substrate 1 by the same process in the manufacturing steps of the conventional semiconductor device shown in FIGS. 29 through 32.

Next, the photoresist 10a is formed in a thickness of 1–3 μm and patterned so that an opening is provided in a region in which the P well 4 is to be formed. Then, boron which is a P type impurity ion is implanted from the first direction at an acceleration voltage of 60 keV to 180 keV and at a dose of $2\times10^{12}$ to $2\times10^{13}/cm^2$ with an inclination of 2 to 9 degrees, thereby forming the channel cut layer 11 (FIG. 23).

Next, boron is implanted from the first direction at an acceleration voltage of 200 keV to 1 MeV and at a dose of $4\times10^{12}$ to $4\times10^{13}/cm^2$ with an inclination of 2 to 9 degrees, thereby forming the retrograde well 12 (FIG. 24). Then, doping is carried out for adjusting a threshold voltage at the NMOSFET, thereby forming the P well 4.

Subsequently, the resist 10b is formed and patterned so that an opening is provided in a region in which the N well 5 is to be formed. Then, phosphor which is an N type impurity ion is implanted from the second direction different from the first direction by 180 degrees in a plan view at an acceleration voltage of 120 keV to 380 keV and at a dose of $2\times10^{12}$ to $2\times10^{13}/cm^2$ with an inclination of 2 to 9 degrees, thereby forming the channel cut layer 13 (FIG. 25).

Figure 26:
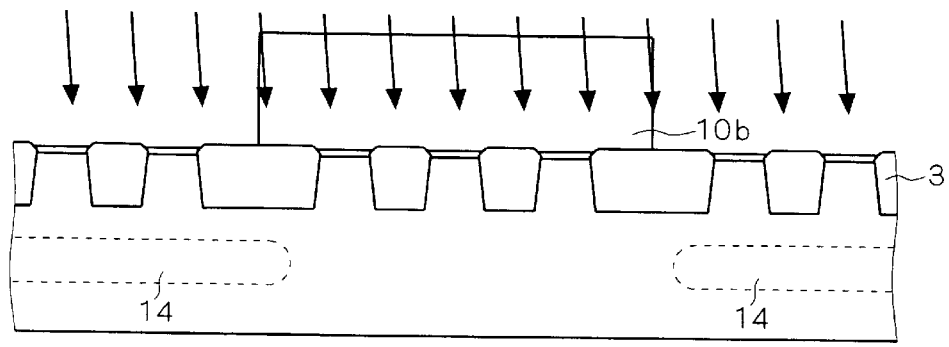

Next, phosphor is implanted from the second direction at an acceleration voltage of 400 keV to 2 MeV and at a dose of $4\times10^{12}$ to $4\times10^{13}/cm^2$ with an inclination of 2 to 9 degrees, thereby forming the retrograde well 14 (FIG. 26). Further, doping is carried out for adjusting a threshold voltage at the PMOSFET, thereby forming the N well 5. The P well 4 and the N well 5 are completed in this way.

The gate electrode, the P type diffusion layer 6 and the N type diffusion layer 7 are formed by the same method shown in FIGS. 9 to 11. An interlayer insulating film, a contact hole, a wiring layer are further formed, thereby completing an LSI device.

Figure 27:
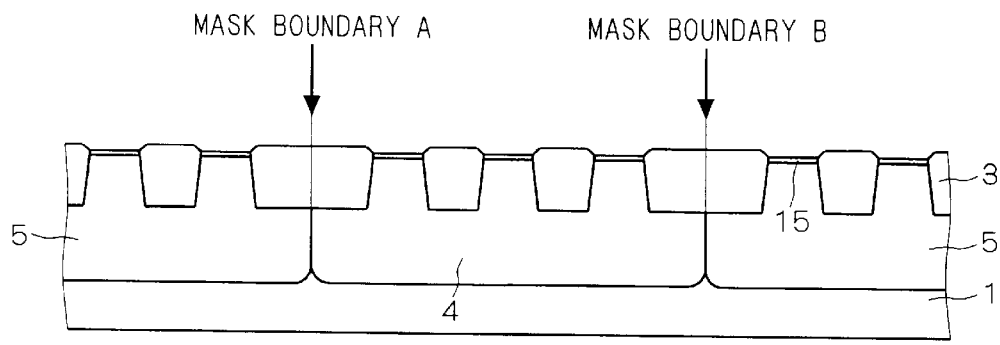

Since the P well 4 and the N well 5 are shifted in two directions different from each other by 180 degrees from their designed positions, shifts of a P well 4 and an N well 5 adjacent to each other are cancelled out by each other. That is, it can be said that the P well 4 and the N well 5 shown in FIG. 22 are equivalent to those shown in FIG. 27 in which the shift of the well boundary is reduced. Therefore, the effective isolation width in the wells is prevented from becoming unbalanced, thereby suppressing degradation in the effective isolation width.

Since the shift of the wells is reduced compared to the case that the P well 4 and the N well 5 are shifted in the same direction as in the conventional semiconductor device shown in FIG. 28, the isolation characteristics between a well and a diffusion layer is improved compared to that in the conventional semiconductor device.

Further, in the present embodiment as well, the wells are limited to a polygonal form constituted by sides which form an angle of 45 degrees with the directions in which impurity ions are implanted when forming the wells, so that the degradation in the isolation characteristics is effectively suppressed and there can be no direction that the isolation characteristics are particularly degraded.

Although the above description has been directed to a structure in which a well has two impurity concentration peaks (a channel cut layer and a retrograde well) in deep positions in the substrate of the semiconductor device, the present invention is not limited to such a scope of application, but is widely applicable to a well having one or more impurity concentration peaks.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

an element isolation region formed in a main surface of a semiconductor substrate and defining an active region; and a well which is formed in said active region including a first impurity concentration peak which is formed at a depth in the vicinity of a bottom of said element isolation region, and further including a second impurity concentration peak which is formed in a position deeper than said first impurity concentration peak and having a same conductivity type as said first impurity concentration peak, wherein said first impurity concentration peak and said second impurity concentration peak are positionally shifted relative to each other in two directions different from each other in a plan view, and wherein said well is a polygon constituted only by sides making an angle of 45 degrees relative to said two directions in a plan view.

2. A semiconductor device comprising:

an element isolation region formed in a main surface of a semiconductor substrate and defining first and second active regions;

a P well formed in said first active region and shifted in a first direction relative to a depth direction of said semiconductor substrate; and an N well formed in said second active region and shifted in a second direction relative to said depth direction of said semiconductor substrate, wherein said first and second directions are different from each other by 180 degrees in a plan view, and wherein said P well and said N well are polygons constituted only by sides making an angle of 45 degrees in a plan view relative to said first and second directions respectively.

* * * * *